United States Patent
Sugiyama et al.

[19]

[11] Patent Number: 5,965,217
[45] Date of Patent: *Oct. 12, 1999

[54] METHOD OF FORMING DLC FILMS OVER INNER SURFACE OF CYLINDRICAL MEMBER

[75] Inventors: Osamu Sugiyama, Tokorozawa; Yukio Miya, Kawagoe; Ryota Koike, Tokorozawa; Takashi Toida, Tokyo; Toshiichi Sekine, Kamifukuoka, all of Japan

[73] Assignee: Citizen Watch Co., Ltd., Tokyo, Japan

[*] Notice: This patent is subject to a terminal disclaimer.

[21] Appl. No.: 08/944,442

[22] Filed: Oct. 6, 1997

[30] Foreign Application Priority Data

Oct. 8, 1996 [JP] Japan .................................. 8-266878

[51] Int. Cl.⁶ .............................. B05D 3/06; B05D 7/22; C23C 16/26
[52] U.S. Cl. ........................ 427/577; 427/237; 427/238; 427/239; 427/255.7; 427/249; 427/122
[58] Field of Search .................................. 427/577, 249, 427/237, 238, 239, 255.7, 122

[56] References Cited

U.S. PATENT DOCUMENTS 5,690,745  11/1997  Grünwald et al. ............. 118/723 MW
5,798,139  8/1998  Nagashima et al. ................... 427/237

FOREIGN PATENT DOCUMENTS 56-6920  1/1981  Japan .
8-131148  1/1996  Japan .

Primary Examiner—Roy V. King
Attorney, Agent, or Firm—Armstrong, Westerman, Hattori, McLeland & Naughton

[57] ABSTRACT

The present invention relates to a method of forming a two-layer intermediate film over the inner surface of a cylindrical member, such as a bushing or a cylinder, with a DLC film being formed on the intermediate film with a uniform thickness by using an auxiliary electrode, greatly enhancing of abrasion resistance of the inner surface. The cylindrical member is placed in a vacuum vessel, an auxiliary electrode of a first intermediate film forming material is inserted in the bore of the cylindrical member, a sputtering gas is supplied into the vacuum vessel, keep the auxiliary electrode at ground potential or a negative DC voltage is applied to the auxiliary electrode to produce a plasma around the auxiliary electrode in order that a first intermediate film is formed over the inner surface of the cylindrical member. A gas containing silicon or germanium is supplied into the vacuum vessel in which the cylindrical member and the auxiliary electrode are disposed, and a voltage is applied to the cylindrical member to produce a plasma, thereby forming a second intermediate film on the first intermediate film. Subsequently, a gas containing carbon, such as methane or the like, is supplied into the vacuum vessel in which the cylindrical member and the auxiliary electrode are disposed, and a voltage is applied to the cylindrical member to produce a plasma in the vacuum vessel in order that the DLC film is formed on the previously formed second intermediate film over the inner surface of the cylindrical member.

21 Claims, 8 Drawing Sheets

METHOD OF FORMING DLC FILMS OVER INNER SURFACE OF CYLINDRICAL MEMBER

BACKGROUND OF THE INVENTION

1. Field of the Invention

The present invention relates to a method of forming films over the inner circumference (surface) of a cylindrical member and, more particularly, to a method of forming films consisting of intermediate films and a hard carbon film for enhancing the abrasion resistance of the inner surface of a cylindrical member (parts), such as a bushing, a cylinder in which a piston reciprocates or a bearing.

2. Description of the Prior Art

A hard carbon film is black and has properties similar to those of diamond. A hard carbon film has advantageous properties including a high mechanical hardness, a small friction coefficient with other materials, a high electrical insulation property, a large thermal conductivity and a high corrosion resistance. Accordingly, there have been proposals for coating various devices, including, medical instruments, magnetic heads, tools and such with a hard carbon film.

A hard carbon film is a hydrogenated amorphous carbon film having properties very similar to those of diamond and hence a hard carbon film is often called a diamondlike carbon film (DLC film) or an i-carbon film.

Proposed in JP-A No. 56-6920 is a film forming method of forming a hard carbon film on a surface of a base member with an enhanced adhesion. This previously proposed film forming method forms an intermediate film of silicon or a silicon compound over a surface of a base member by sputtering using a gas containing argon gas and carbon, and then a hard carbon film is formed on the intermediate film.

Such a prior art method of forming a film consisting of an intermediate film and a hard carbon film over the inner surface of a cylindrical member (base member) of carbon tool steel, such as a bushing, will be described with a figure.

FIG. 9 is showing a method of forming an intermediate film such as under layer of hard carbon film by carrying out the prior art method as a sectional view. A target 30 of an intermediate film forming material, such as silicon or a silicon compound, and a cylindrical member 11 having a bore 11a defined by an inner surface 11b, are disposed opposite to each other in a vacuum vessel 13 as shown in FIG. 9.

Gases are removed through a gas outlet port 17 from the vacuum vessel 13 by an evacuating means, not shown, to evacuate the vacuum vessel 13. Then, argon (Ar) gas, i.e., a sputtering gas, is supplied through a gas inlet port 15 into the vacuum vessel 13. A negative DC voltage is applied to the target 30 by a target power source 39 and a negative DC voltage is applied to the cylindrical member 11 by a DC power source 25.

A plasma is thus produced in the vacuum vessel 13 to make the target 30 sputter by bombarding the surface of the target 30 of the intermediate film forming material with ions. Consequently, particles of the intermediate film forming material sputtered from the target 30 are deposited over the inner surface 11b of the cylindrical member 11 thus forming an intermediate film of silicon or a silicon compound.

After then, a hard carbon film is formed on the intermediate film by a conventional film forming method as shown in FIG. 10.

Referring to FIG. 10, the cylindrical member 11 having its inner surface deposited with the intermediate film is placed in a vacuum vessel 13 provided with a gas inlet port 15 and a gas outlet port 17. The vacuum vessel 13 is evacuated by an evacuating means, not shown. Then, a gas which contains carbon is supplied through the gas inlet port 15 into the vacuum vessel 13 and the pressure in the vacuum vessel 13 is adjusted to a set pressure.

Afterward, a positive DC voltage is applied to an anode 31 placed in the vacuum vessel by an anode power source 27, an AC voltage is applied to a filament 33 by a filament power source 29, and a negative DC voltage is applied to the cylindrical member 11 by the DC power source 25. Thus, a plasma is produced in the vacuum vessel 13 to deposit a hard carbon film on the intermediate film formed over the inner surface of the cylindrical member 11.

The hard carbon film forming method shown in FIG. 10 uses the plasma produced by the DC voltage applied to the cylindrical member 11 and the plasma produced by the filament 33 energized by an AC voltage and the anode 31 energized by the DC voltage. Either the plasma produced around the cylindrical member 11 or the plasma produced around the filament 33 and the anode 31 contributes mainly to hard carbon film formation depending on the pressure in the vacuum vessel 13 during hard carbon film formation.

For example, when the pressure in the vacuum vessel 13 is $3\times10^{-3}$ torr or above, the plasma produced around the cylindrical member 11 mainly contributes to the decomposition of the gas containing carbon to form the hard carbon film.

Although a hard carbon film can be formed uniformly over the outer surface of the cylindrical member 11 by the dominant contribution of this plasma, a hard carbon film formed over the inner surface 11b defining the bore 11a is inferior in adhesion, hardness and quality. This is because the same voltage is applied to the cylindrical member 11, and the inner surface defines a space in which electrodes of the same polarity are disposed opposite to each other, and the plasma prevailing in the bore 11a causes an abnormal discharge called hollow discharge. A hard carbon film formed by hollow discharge is a polymerlike film inferior in adhesion and apt to come off the cylindrical member 11 and have a relatively low hardness.

When the pressure in the vacuum vessel 13 is below $3\times10^{-3}$ torr, the plasma produced in the neighborhood of the filament 33 and the anode 31 contributes mainly to hard carbon film formation.

Although a hard carbon film can uniformly be formed over the outer surface of the cylindrical member 11 by the dominant contribution of this plasma, the hard carbon film cannot be formed with a uniform thickness with respect to a direction along the axis of the cylindrical member 11 over the inner surface 11b defining the bore 11a. Carbon ions produced by the plasma produced around the filament 33 and the anode 31 are attracted to the surface of the cylindrical member 11 by the negative DC potential of the cylindrical member 11 to deposit the hard carbon film over the surface of the cylindrical member.

The hard carbon film is formed by a chemical vapor deposition process when the pressure in the vacuum vessel 13 is above $3\times10^{-3}$ torr, and the hard carbon film is formed by a physical vapor deposition process when the pressure in the vacuum vessel 13 is below $3\times10^{-3}$ torr. Therefore, the thickness of the hard carbon film formed over the inner surface 11b of the cylindrical member 11 decreases from the open end of the bore 11a downwards with the depth, which occurs when forming a film by a physical vapor-phase epitaxial growth process, such as a vacuum deposition process, when the plasma produced around the filament 33 and the anode 31 contributes mainly to hard carbon film formation. Consequently, the hard carbon film cannot be formed with a uniform thickness over the entire inner surface of the cylindrical member 11.

Similarly, the thickness of the intermediate film formed over the inner surface 11b of the cylindrical member 11 decreases from the open end of the bore 11a downwards with the depth when the intermediate film is formed by the method previously described with reference to FIG. 9.

FIG. 11 is a graph showing a thickness distribution in an intermediate film formed over the inner surface of a cylindrical member, in which distance from the open end of the cylindrical member is measured on the horizontal axis and thickness is measured on the vertical axis. In FIG. 11, curve a indicates the variation of the thickness of the intermediate film formed by the method described in reference to FIG. 9 with the distance from the open end of the bore of the cylindrical member.

As is obvious from curve a, the thickness of an intermediate film formed by the conventional method decreases sharply from 0.5 μm at the open end of the bore to 0.1 μm at a position 30 mm from the open end.

When a hard carbon film is formed on the intermediate film having such a sharply changing thickness, the portion of the hard carbon film formed in the vicinity of the open end of the cylindrical member sticks to the intermediate film with an enhanced adhesion, whereas the adhesion of the portion of the hard carbon film formed in the depth of the bore decreases with the distance from the open end. Therefore, the portion formed in the depth of the bore is apt to come off.

Since the portion of the intermediate film in the depth of the cylindrical member is thin and is unable to withstand stress induced in the hard carbon film, the intermediate film and the hard carbon film come off the cylindrical member. This is a problem.

Thus, the hard carbon film and an intermediate layer formed by the conventional method over the inner surface of a cylindrical member cannot fully exercise advantageous characteristics thereof including high abrasion resistance and high corrosion resistance.

SUMMARY OF THE INVENTION

It is an object of the present invention to solve the foregoing problems, and to form an intermediate film with a uniform thickness over the inner surface of a cylindrical member and form a hard carbon film with a uniform thickness on the intermediate film so as to stick to the intermediate film with an enhanced adhesion.

With this object in view, the present invention provides a film forming method comprising: first and second intermediate film forming processes for forming a first intermediate film (lower film) capable of adhering to the cylindrical member, a second intermediate film (upper film) capable of sticking to a hard carbon film respectively over the inner surface of a cylindrical member, and a hard carbon film forming process for forming the hard carbon film on the second intermediate film.

In both the intermediate films forming processes and the hard carbon film forming process, an auxiliary electrode is inserted in the bore of the cylindrical member defined by the inner surface, and a voltage is applied across the auxiliary electrode and the cylindrical member to form a film by a plasma sputtering process, a resistance heating evaporation process or a chemical vapor deposition process (CVD process).

In the first intermediate film forming process, the first intermediate film is formed over the inner surface of the cylindrical member by sputtering or resistance heating evaporation using an auxiliary electrode formed of a first intermediate film forming material (titanium or chromium) with a sputtering gas such as argon.

In the second intermediate film forming process, the second intermediate film formed of a silicon film or germanium film is formed on the first intermediate film over the inner surface of the cylindrical member by supplying a gas containing silicon or germanium into a vacuum vessel to produce a plasma using an auxiliary electrode formed of a metal material such as the above-mentioned material or stainless steel.

In either case, the cylindrical member is placed in a vacuum vessel and kept at a ground potential or a negative DC voltage is applied to the cylindrical member, while a negative DC voltage, a radio frequency voltage or an AC voltage is applied to the auxiliary electrode.

In the hard carbon film forming process, the cylindrical member provided with the first and second intermediate films over its inner surface is placed in a vacuum vessel, and an auxiliary electrode which is kept at ground potential or to which a DC voltage is applied is inserted in the bore of the cylindrical member. Then, the vacuum vessel is evacuated, a gas containing carbon, such as benzene ($C_6H_6$) or methane ($CH_4$) is supplied into the vacuum vessel, a voltage is applied to the cylindrical member to produce a plasma in the vacuum vessel, and a hard carbon film is formed on the second intermediate film formed over the inner surface of the cylindrical member by a plasma CVD process.

The plasma is produced by applying a negative DC voltage or a radio frequency power to the cylindrical member or by applying a DC voltage to the cylindrical member and applying a DC voltage to an anode and applying an AC voltage to a filament disposed in the vacuum vessel.

The first and second intermediate film forming processes and the hard carbon film forming process may be carried out respectively in separate vacuum vessels, or may continuously be carried out in one vacuum vessel.

The cylindrical member is a member having an inner surface to be brought into contact with another member, such as a guide bushing, a cylinder or a bearing and may be a cylindrical member having one or both ends open. Generally, the present invention is applied to a cylindrical member made of an alloy tool steel (SK steel). However, the present invention is applicable to a cylindrical member made of an insulating material, such as a ceramic material, and a cylindrical member formed by coating the inner surface of a cylindrical base with a superhard alloy or a ceramic material by brazing or the like.

When the cylindrical member is made of an insulating material, the cylindrical member cannot be kept at a ground potential and is kept at a floating potential during the first intermediate film forming process. However, positive ions of the material for forming the intermediate film sputtered from the auxiliary electrode are attracted to the inner surface of the cylindrical member at a floating potential lower than that of the ions, so that a first intermediate film can be deposited over the inner surface of the cylindrical member.

In the second intermediate film forming process and the hard carbon film forming process, a first intermediate film formed of a metal intermediate film can be formed over the inner surface of the cylindrical member even if the same is made of an insulating material because the inner surface is coated with the first intermediate film of metal film and then a voltage can be applied to the cylindrical member.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the present invention will be described hereinafter with reference to the accompanying drawings.

Figure 1:
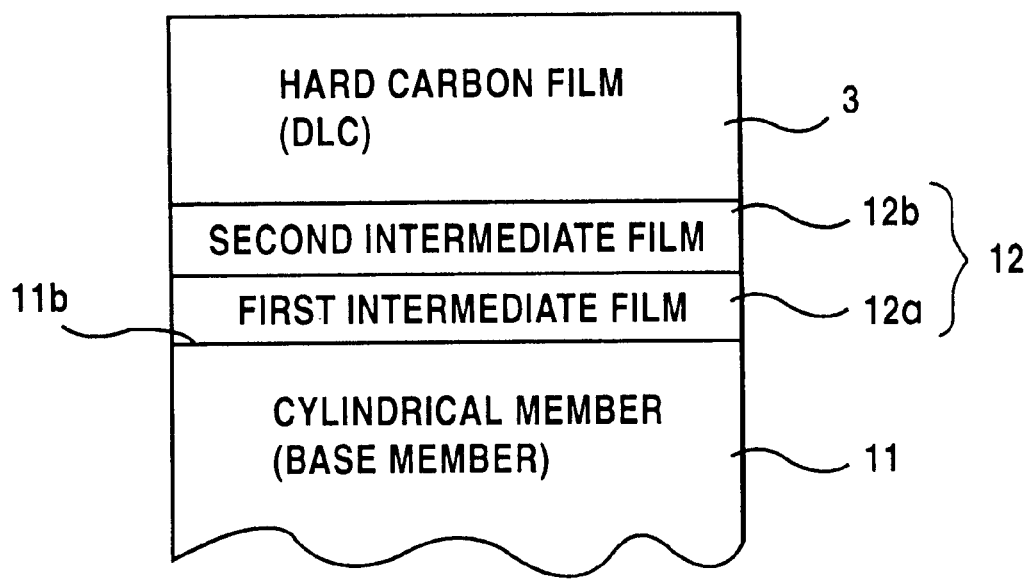
FIG. 1 shows enlarged typical sectional views of a film to be formed over the inner surface of a cylindrical member by a film forming method in accordance with the present invention.

FIG. 1 is an enlarged typical view of films to be formed over the inner surface of a cylindrical member by a film forming method in accordance with the present invention.

A film formed on an inner surface of a cylindrical member shown in FIG. 1 comprises a two-layer intermediate film 12 composed of a first intermediate film 12a for enhancing adhesion to a base material and a second intermediate film 12b for enhancing adhesion to a hard carbon film formed over the inner surface 11b of a cylindrical member 11 made of a base material, such as an alloy tool steel, and the hard carbon film (DLC film) 3 formed on the intermediate film 12.

The first intermediate film 12a of the two-layer intermediate film 12 is made of a titanium (Ti) film, a chromium (Cr) film, an aluminum (Al) film or a metal silicide film such as a titanium-silicon alloy, a carbon-silicon alloy, and a chromium-silicon alloy or a titanium-germanium alloy film, a chromium-germanium alloy film, an aluminum-silicon alloy film, etc.

The second intermediate film 12b is made of a silicon (Si) film or a germanium (Ge) film or a silicon-carbon alloy film, etc.

Described hereinafter are forming processes for the aforementioned first intermediate film 12a, the second intermediate film 12b and the hard carbon film 3.

Figure 2:
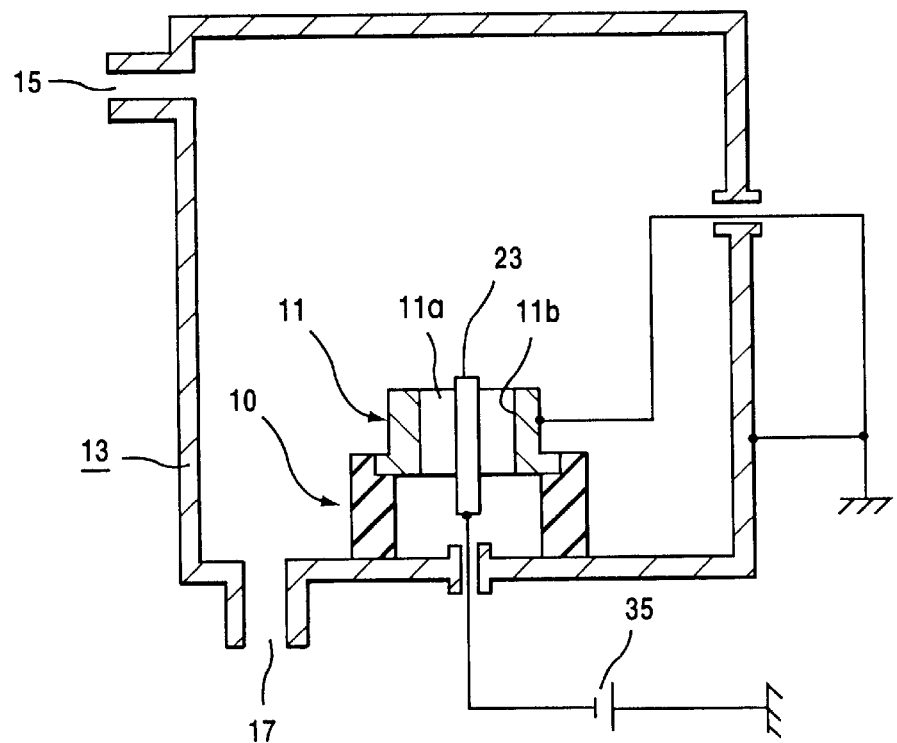
FIG. 2 is a schematic sectional view for explaining an example of a first intermediate film forming process included in a film forming method in an embodiment according to the present invention.

First Intermediate Film Forming Process in Example 1: FIG. 2

A first intermediate film forming process in Example 1 for forming the first intermediate film over the inner surface of a cylindrical member will be described with reference to FIG. 2, on an assumption that the first intermediate film 12a shown in FIG. 1 is made of a titanium film Referring to FIG. 2, a cylindrical member 11 having a bore 11a is fixedly mounted at the bottom thereof on an insulating work support 10 in a vacuum vessel 13 provided with a gas inlet port 15 and a gas outlet port 17. The cylindrical member 11 is a member such as a bushing, a cylinder or a bearing, made of a metal, for example, such as an alloy tool steel (SK steel). The cylindrical member 11 and the vacuum vessel 13 are connected to ground to keep the same at a ground potential.

A rod-shaped auxiliary electrode 23 of a titanium material is inserted in the bore 11a of the cylindrical member 11 coaxially with the latter.

The vacuum vessel 13 is evacuated to a vacuum of $3 \times 10^{-5}$ torr by an evacuating means, not shown. Then, Ar gas, i.e., a sputtering gas, is supplied through the gas inlet port 15 into the vacuum vessel 13 so that the interior of the vacuum vessel 13 is kept at a vacuum of $5 \times 10^{-3}$ torr.

A DC power source 35 applies −500 V DC to the auxiliary electrode 23 to produce a plasma around the auxiliary electrode 23 in the bore 11a of the cylindrical member 11. The surface of the auxiliary electrode 23 is bombarded with the ions of the plasma and the auxiliary electrode 23 sputters atoms of the titanium material.

For example, it is preferable that the diameter of the auxiliary electrode 23 is about 2 mm when the inside diameter of the cylindrical member 11 (the diameter of the bore 11a) is 10 mm. The auxiliary electrode 23 need not necessarily have a circular section, but may have a triangular section, a square section or any other polygonal section.

Molecules of the materials for forming the intermediate film are sputtered from the surface of the auxiliary electrode 23 and deposited on the inner surface 11b of the cylindrical member 11 to form the first intermediate film 12a of the titanium film. The sputtering is continued for 30 minutes to form a 0.5 $\mu$m thick titanium film as the intermediate film in the interior of the bore of the cylindrical member 11.

Thus, in the first intermediate film forming process in this embodiment, the auxiliary electrode 23 of the material for forming the intermediate film is inserted in the bore 11a of the cylindrical member 11 and a plasma is produced around the auxiliary electrode 23 in the bore 11a to form the first intermediate film over the inner surface 11b of the cylindrical member 11. Since the plasma produced around the auxiliary electrode 23 in the bore 11a of the cylindrical member 11 has a uniform ion density distribution along the axis of the cylindrical member 11, the first intermediate film 12a (FIG. 1) can be formed over the inner surface 11b with a uniform thickness.

Figure 3:
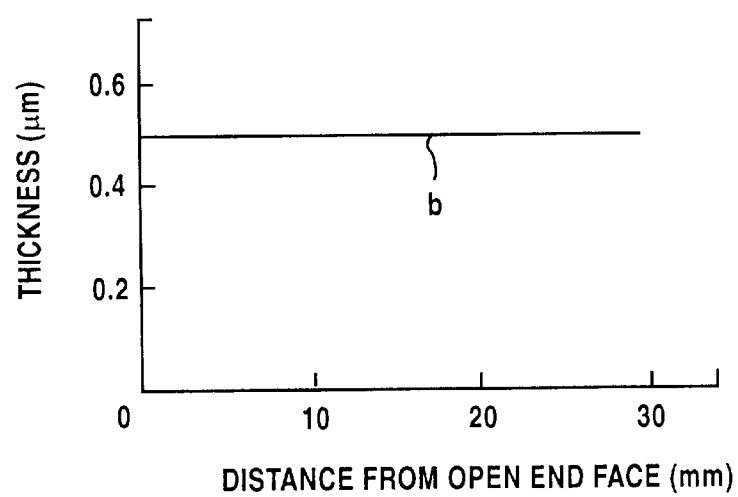
FIG. 3 is a graph showing a thickness distribution in a first intermediate film formed over the inner surface of a cylindrical member by an intermediate film forming process in accordance with the present invention.

FIG. 3 shows the thickness distribution of the first intermediate film formed by the first intermediate film forming process, in which the distance from one open end of the cylindrical member 11 is measured on the horizontal axis, the thickness of the first intermediate film formed over the inner surface 11b of the cylindrical member 11 is measured on the vertical axis, and curve b indicates the variation of the thickness.

As shown in FIG. 3, the thickness of the first intermediate film at the open end of the cylindrical member 11 is 0.5 $\mu$m, the thickness at 30 mm from the open end is substantially the same as the thickness at the open end, and the first intermediate film of titanium film is formed with a uniform thickness over the entire inner surface 11b.

In the first intermediate film forming process, although it was explained that the cylindrical member 11 is kept at a ground potential, a negative DC voltage may instead be applied to the cylindrical member 11.

The second intermediate film 12b shown in FIG. 1 is formed on the first intermediate film 12a formed over the inner surface of the cylindrical member 11, then the hard carbon film 3 is formed on the second intermediate film. The second intermediate film forming process and the hard carbon film forming process will be described later.

Figure 4:
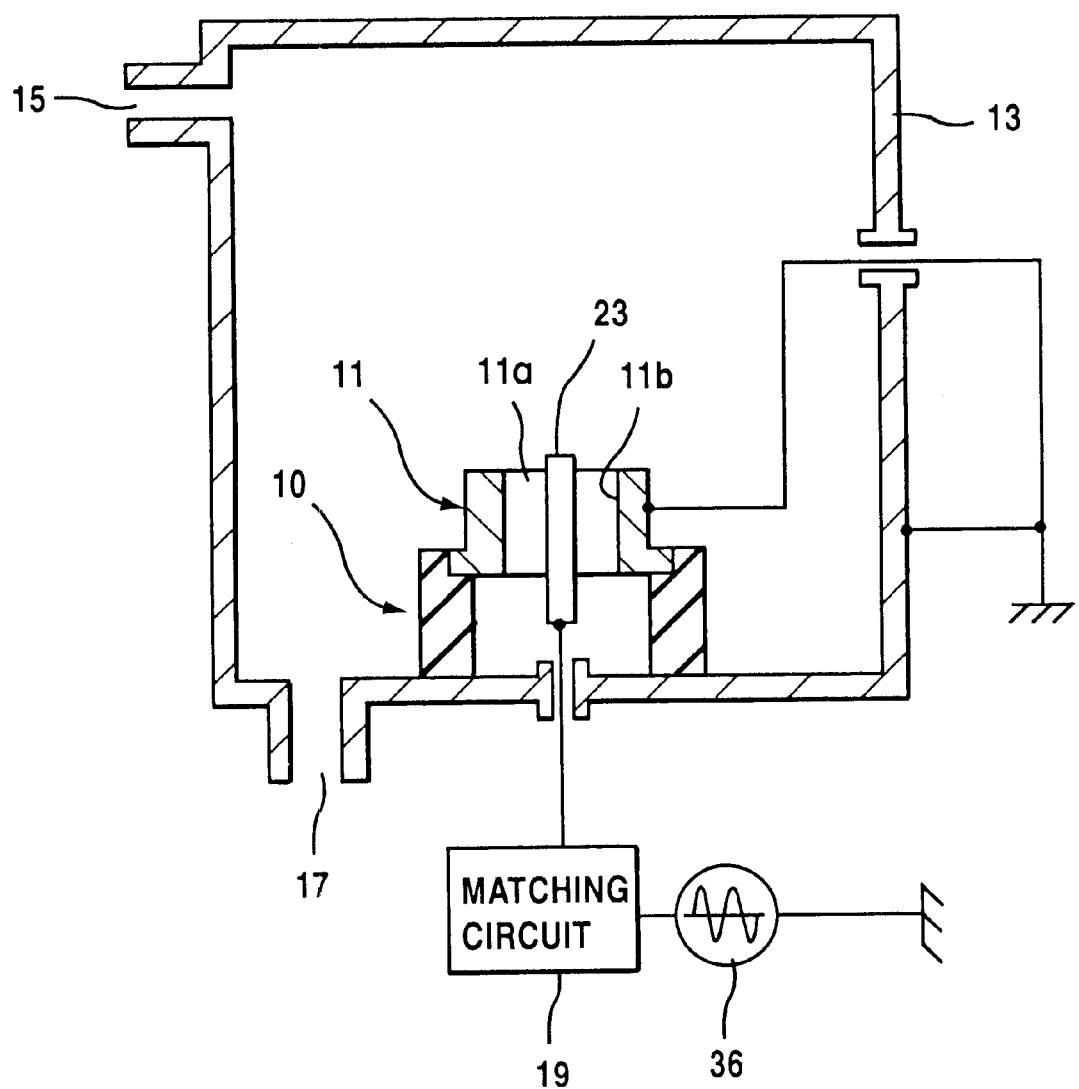
FIGS. 4 and 5 are schematic sectional views for explaining another different examples of a first intermediate film forming process included in a film forming method according to the present invention.

First Intermediate Film Forming Process in Example 2: FIG. 4

A first intermediate film forming process in Example 2 for forming the first intermediate film over the inner surface of a cylindrical member will be described with reference to FIG. 4, in which parts like or corresponding to those shown in FIG. 2 are designated by the same reference characters and the description thereof will be omitted.

The first intermediate film forming process in the second example differs from that in Example 1 previously described with reference to FIG. 2 only in that a radio frequency power is applied through a matching circuit 19 to an auxiliary electrode 23 inserted coaxially in the bore 11a of a cylindrical member 11 by a radio frequency power source 36 of, for example, 400 W in power capacity.

A plasma is thus produced around the auxiliary electrode 23 in the bore 11a of the cylindrical member 11, the surface of the auxiliary electrode 23 of a titanium material is bombarded with the ions of the plasma, and titanium (Ti) molecules of the material for forming the intermediate film are thus sputtered from the surface of the auxiliary electrode 23 and deposited uniformly on the inner surface of the cylindrical member 11.

Thus, the first intermediate film 12a of titanium film can be formed with a uniform thickness as indicated by the curve b in FIG. 3.

Since other conditions, etc., in this example are similar to Example 1, the description thereof will be omitted.

Figure 5:
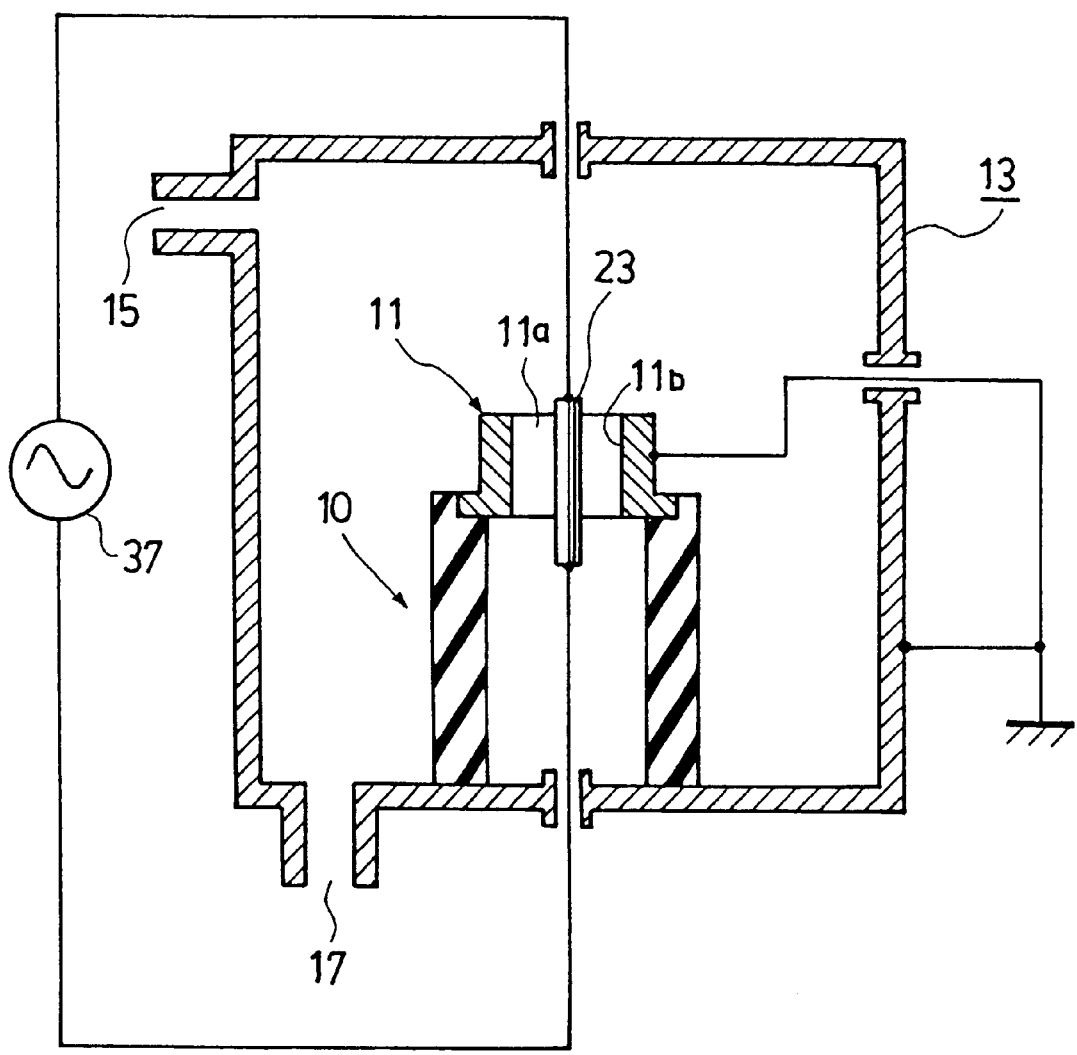

First Intermediate Film Forming Process in Example 3: FIG. 5

A first intermediate film forming process in Example 3 for forming the first intermediate film over the inner surface of a cylindrical member will be described with reference to FIG. 5, in which parts like or corresponding to those shown in FIG. 2 are also designated by the same reference characters and the description thereof will be omitted.

The first intermediate film forming process in the third example differs from that in Example 1 previously described with reference to FIG. 2 only in that the opposite ends of an auxiliary electrode 23, made of a titanium film for the material of the intermediate film, inserted coaxially in the bore 11a of the cylindrical member 11 are connected to an AC power source 37.

After evacuating a vacuum vessel 13 to a vacuum of $3\times10^{-5}$ torr, the AC power source 37 supplies a current of, for example, 2 A to the auxiliary electrode 23 while Ar gas is not supplied into the vacuum vessel 13.

Then, the surface of the auxiliary electrode 23 inserted in the bore 11a of the cylindrical member 11 is melted by resistance heating and molten titanium-silicon alloy evaporates because the vacuum vessel 13 is evacuated to a high vacuum. Thus, the evaporated titanium molecules are deposited on the inner surface 11b of the cylindrical member 11 by resistance heating evaporation to form the first intermediate film of titanium film.

Since the material for forming the intermediate film is caused to evaporate uniformly over the entire length of the bore 11a of the cylindrical member 11 from the surface of the auxiliary electrode 23 by resistance heating, the first intermediate film can be formed with a uniform thickness over the entire inner surface 11b of the cylindrical member 11 as shown in FIG. 3.

Since other conditions, etc., in this example are similar to Example 1, the description thereof will be omitted.

Although the auxiliary electrodes 23 employed in the first intermediate film forming process may be of any thickness, as long as the thickness thereof is smaller than the diameter of the bore 11a of the cylindrical member 11, preferably, the auxiliary electrode 23 has a thickness that allows for a space of about 4 mm between the inner surface 11b of the cylindrical member 11 and the auxiliary electrode 23 to secure a sufficient space for producing the plasma therein. Preferably, the auxiliary electrode 23 has a length substantially equal to or slightly greater than the length (axial dimension) of the bore 11a when it is inserted into the bore 11a of the cylindrical member 11.

In each of the foregoing examples, there has been described that the auxiliary electrode 23 is made of titanium and the first intermediate film 12a is made of the titanium film. However, the auxiliary electrode 23 is not limited thereto. For example, the auxiliary electrode 23 may be made of chromium (Cr), aluminum (Al), or a titanium-silicon alloy, a carbon-silicon alloy, a chromium-silicon alloy, a titanium-germanium alloy, and the first intermediate film 12a may be formed of metal films or an alloy film thereof.

Figure 6:
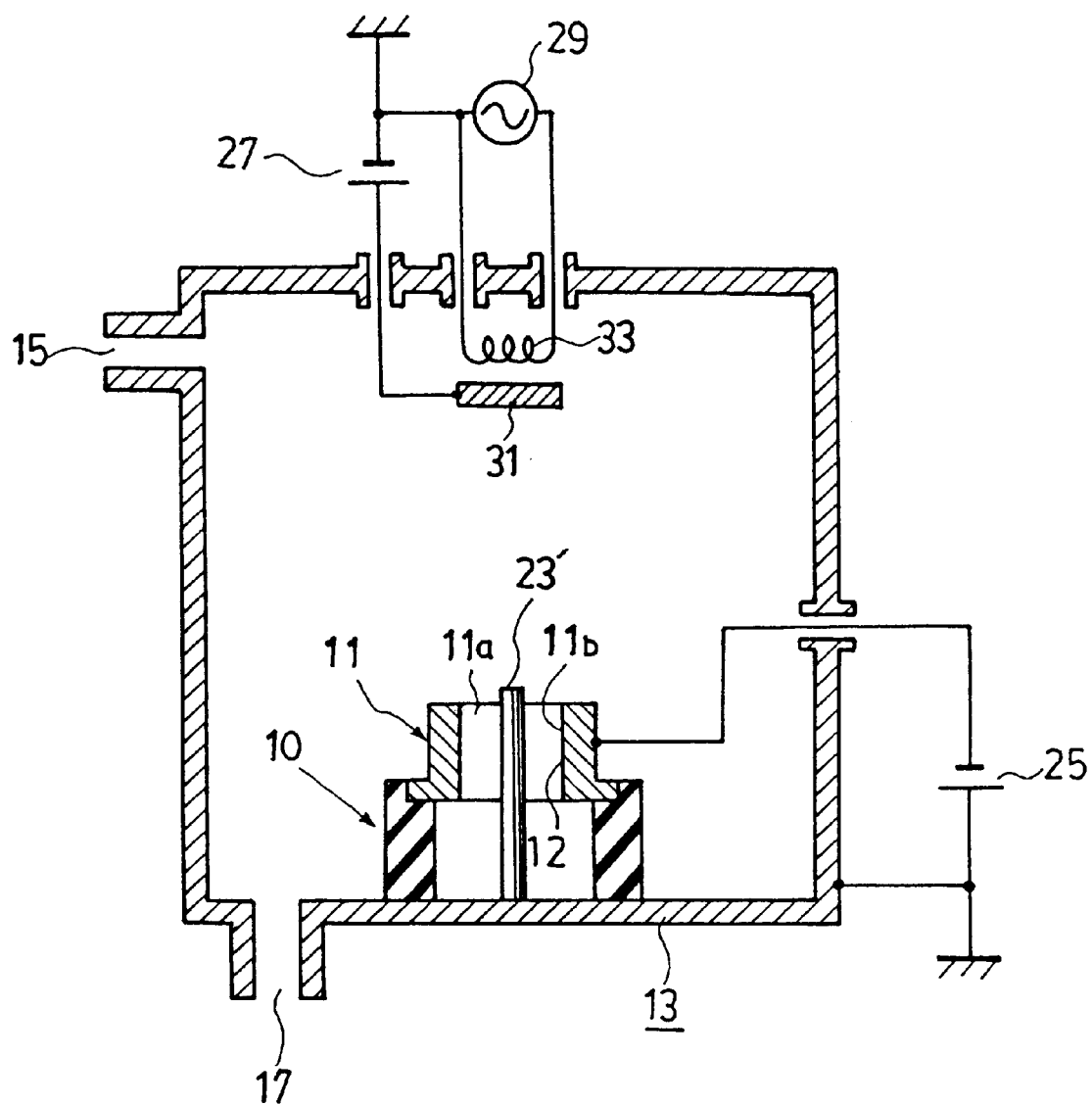
FIGS. 6, 7 and 8 are schematic sectional views for explaining a second intermediate film forming process and different examples of a hard carbon film forming process included in a film forming method in accordance with the present invention.

Second Intermediate Film Forming Process in Example 1: FIG. 6

Described next is a second intermediate film forming process for forming a second intermediate film 12b as shown in FIG. 1 on the first intermediate film 12a formed over the inner surface 11b of the cylindrical member 11 as set forth above. Although in this case there are three processes, an example 1 thereof will be described with reference to FIG. 6.

In the second intermediate film forming process, a vacuum vessel 13 having a gas outlet port 17 and gas inlet port 15, and an anode 31 and a filament 33 provided therein is employed. A cylindrical member 11 forming a first intermediate film 12a over the inner surface of the vacuum vessel 13 is disposed in the vacuum vessel 13 while the lower portion thereof is fixed to an insulating work support 10.

An auxiliary electrode 23' is inserted in a bore 11a of the cylindrical member 11 and disposed along the central axial line thereof. The auxiliary electrode 23' is connected to ground by way of the vacuum vessel 13 and is kept at a ground potential. As the auxiliary electrode 23', the auxiliary electrode 23 used in the first intermediate film forming process may be continuously used as it is or a different rod-shaped one made of a metal material such as stainless steel may be used.

The vacuum vessel 13 is evacuated by an evacuating means, not shown, through the gas outlet port 17 so that the interior of the vacuum vessel 13 is at a vacuum of $3\times10^{-5}$ torr.

Thereafter, monosilane ($SiH_4$), i.e., gas containing silicon, is supplied through the gas inlet port 15 into the vacuum vessel 13, thereby controlling the interior of the vacuum vessel 13 to be kept at a vacuum of $5\times10^{-3}$ torr.

Then, a DC voltage of +10 V is applied from an anode power source 27 to the anode 31, and an AC voltage of 10 V is applied from a filament power source 29 to a filament 33 so that a current of 30 A flows to the filament 33. A DC voltage of −3 kV is applied from a DC power source 25 to the cylindrical member 11.

At this time, since the auxiliary electrode 23' having a ground potential is inserted into and disposed at the bore 11a of the cylindrical member 11, a plasma is produced not only in an outer periphery of the cylindrical member 11, but also in the bore 11a. Accordingly, a silicon film of the second intermediate film having a thickness of about 0.5 μm is formed on the first intermediate film (titanium film) of the inner surface 11b of the cylindrical member 11 by a plasma CVD process.

As mentioned above, since the auxiliary electrode 23' having the ground potential is disposed between the inner surface 11b where electrodes having the same potential oppose each other in the cylindrical member 11 when the second intermediate film forming process is performed after the auxiliary electrode 23' is disposed in the bore 11a of the cylindrical member 11, a hollow discharge, i.e., abnormal discharge, does not occur, thereby enhancing adhesion of the second intermediate film.

Further, the potential characteristic is made uniform on the entire length of the axial direction of the bore 11a of the cylindrical member 11, and the film thickness of the second intermediate film formed on the first intermediate film (titanium film) of the inner surface 11b is not varied so that the second intermediate film can be formed over the entire inner surface 11b with a uniform thickness from the portion close to the open end to the depth thereof in the same manner as the film thickness of the first intermediate film shown in FIG. 3.

When a two-layer intermediate film 12 is formed in such a manner, titanium constituting the first intermediate lower film 12a shown in FIG. 1 serves to keep adhesion with the cylindrical member 11, and silicon constituting the second intermediate upper film 12b serves to connect strongly to a hard carbon film 3, while subject to the covalent bond therewith, described later, and is strongly adhered to the hard carbon film 3.

Although there is explained in the embodiment that the gas supplied through the gas inlet port 15 is monosilane, i.e., a gas containing silicon, instead, the second intermediate film formed of germanium film after supplying a gas containing germanium (Ge) may be formed.

It is also possible to use disilane ($Si_2H_6$), i.e., a gas containing silicon may be used. Further, hydrogen ($H_2$), helium (He) or argon (Ar) may be added to a gas containing silicon such as monosilane or disilane, or a gas containing carbon such as methane or ethylene may be mixed with the gas containing silicon such as monosilane or disilane. In this case, a silicon-carbon alloy film is formed as the second intermediate film 12b.

Although the auxiliary electrode 23' is kept at a ground potential in the second intermediate film forming process, a positive DC voltage may be added to the auxiliary electrode 23'.

Figure 7:
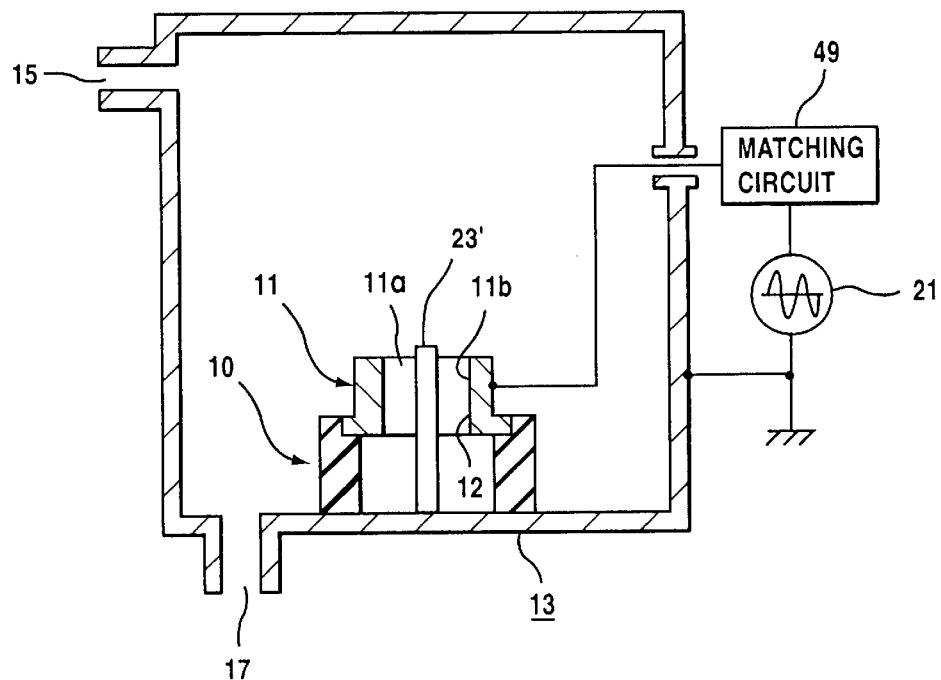

Second Intermediate Film Forming Process in Example 2: FIG. 7

Also in the second intermediate film forming process in Example 2, the same process as the aforementioned first example is performed but the anode 31 and the filament 33 shown in FIG. 6 are not provided in the vacuum vessel 13 to be used as shown in FIG. 7.

The process comprises inserting an auxiliary electrode 23' in a bore 11a of the vacuum vessel 13, disposing a cylindrical member 11 having a first intermediate film 12a formed over an inner surface 11b, evacuating the vacuum vessel 13 to a vacuum of $3\times10^{-5}$ torr, then supplying monosilane ($SiH_4$), i.e., a gas containing silicon, from a gas inlet port 15 so that the interior of the vacuum vessel 13 is adjusted to be at a vacuum of 0.1 torr.

A radio frequency power source 21 of 13.56 MHz having oscillation frequency applies a radio frequency power of 400 W through a matching circuit 49 to the cylindrical member 11 to produce a plasma around the cylindrical member 11 including a bore 11a in the vacuum vessel 13.

Accordingly, a second intermediate film formed of a silicon film which may be easily adhered to a hard carbon film is formed with a uniform thickness over a first intermediate film of the inner surface 11b of the cylindrical member 11 by a plasma CVD process, thereby forming a two-layer intermediate film 12.

Since other conditions, functions and effects thereof are the same as those of the second intermediate film forming process in Example 1 set forth above, the description thereof will be omitted.

Figure 8:
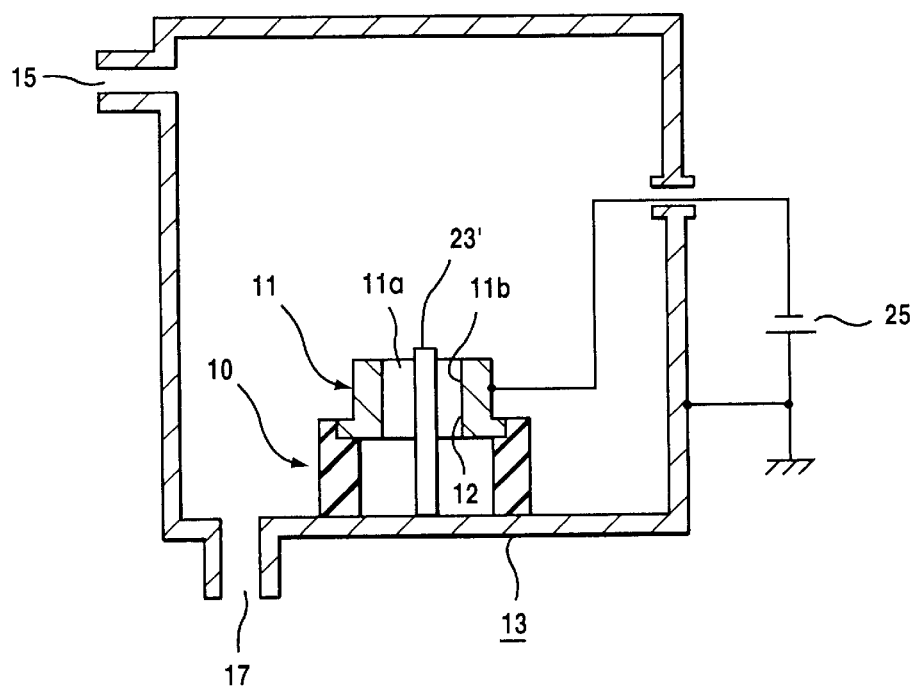
Figure 9:
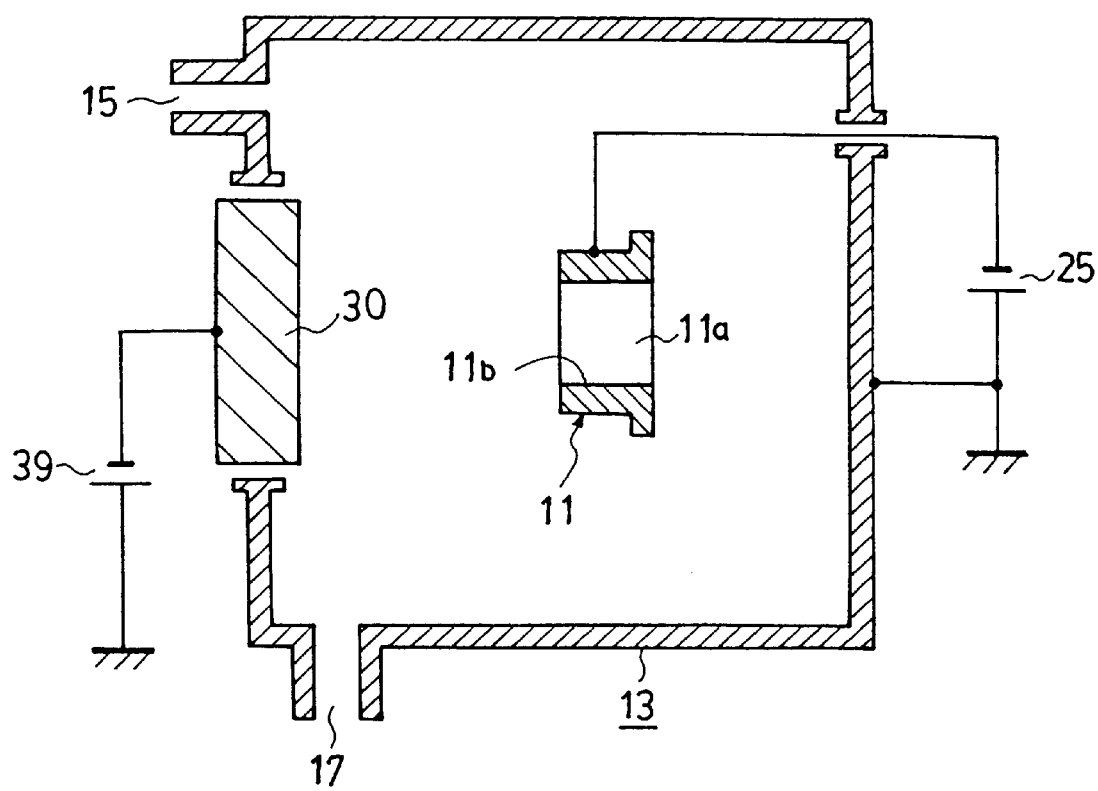
FIG. 9 is a schematic sectional view for explaining a prior art method of forming an intermediate film underlying a hard carbon film.
Figure 10:
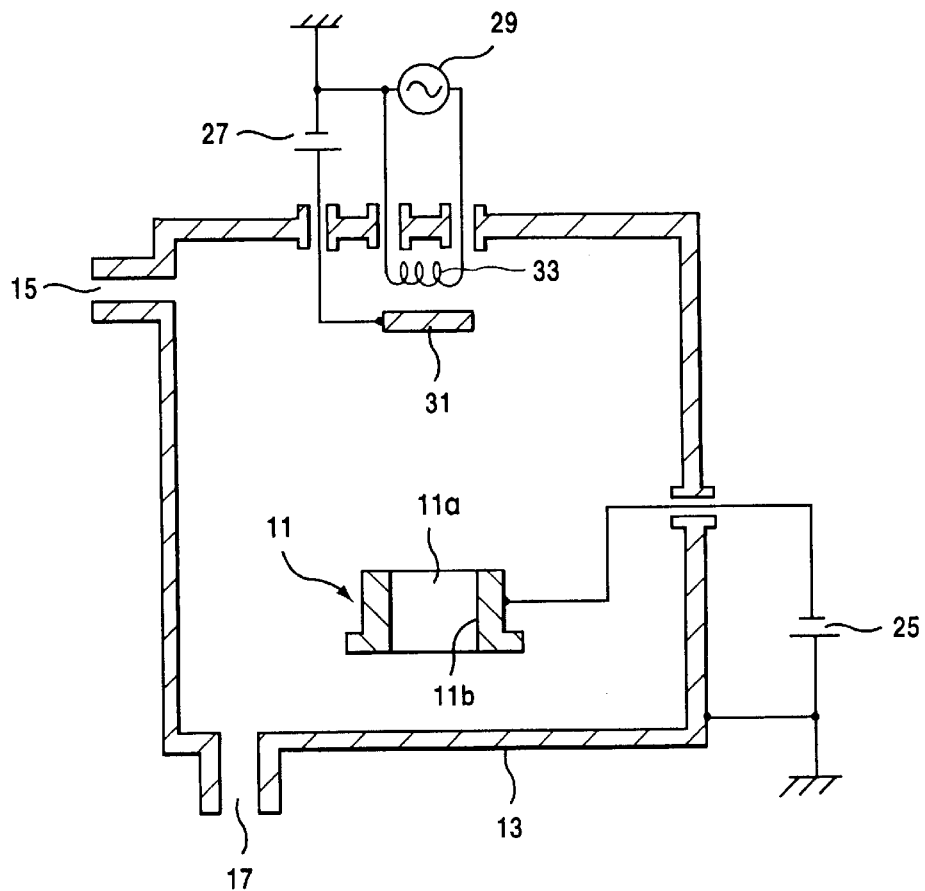
FIG. 10 is a schematic sectional view for explaining a prior art method of forming a hard carbon film.
Figure 11:
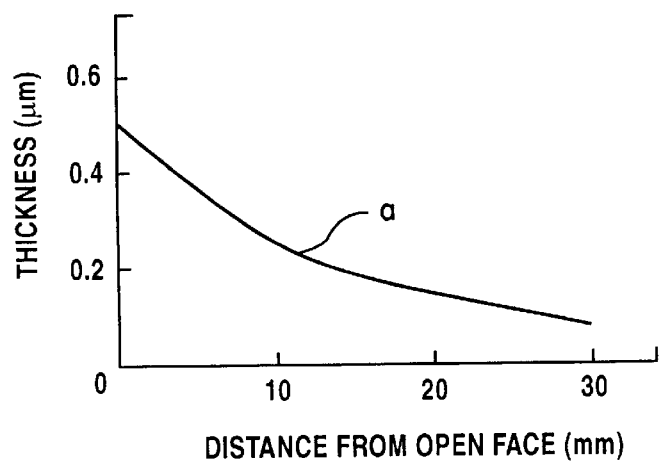
FIG. 11 is a graph showing a thickness distribution in an intermediate film formed over the inner surface of a cylindrical member by a prior art method.

Second Intermediate Film Forming Process in Example 3: FIG. 8

Also in the second intermediate film forming process in Example 3, the same process as the aforementioned Example 1 is performed. That is, a cylindrical member 11 having a first intermediate film 12a formed over the inner surface 11b is disposed in the vacuum vessel 13 while the lower portion thereof is fixed to the vacuum vessel 13 by an insulating work support 10, and an auxiliary electrode 23' connected to ground is inserted in the center of a bore 11a of the vacuum vessel 13.

The vacuum vessel 13 is evacuated so that the vacuum vessel 13 connected to ground is kept at a vacuum of $3\times10^{-5}$ torr, then monosilane ($SiH_4$), i.e., a gas containing silicon is supplied through the gas inlet port 15 into the vacuum vessel 13 so that the interior of the vacuum vessel 13 is adjusted to be at a vacuum of 0.1 torr.

Further, a DC voltage of −600 V is applied from the DC power source 25 to the cylindrical member 11 so as to produce a plasma in the vacuum vessel 13.

Accordingly, the second intermediate film 12b formed of a silicon film which is excellent in adhesion to a hard carbon film 3 is formed with a uniform thickness on the first intermediate film 12a of the inner surface 11b of the cylindrical member 11 by a plasma CVD process, thereby forming the two-layer intermediate film 12. Since other conditions, functions and effects are the same as those of Example 1 of the second intermediate film set forth above, the description thereof will be omitted.

Hard Carbon Film Forming Process in Example 1: FIG. 6

The hard carbon film 3 shown in FIG. 1 is formed on the second intermediate film of the cylindrical member 11 formed the two-layer intermediate film 12 over inner surface by any one of the foregoing first and second intermediate film forming processes, by one of the following three hard carbon film forming processes. The apparatus to be used in the three hard carbon film forming processes is the same as that used in the three second intermediate film forming processes shown in FIGS. 6 to 8, each hard carbon film forming process will be described again with reference to FIGS. 6 to 8.

A hard carbon film forming process in example 1 will be described with reference to FIG. 6, in which parts corresponding to those shown in FIGS. 2, 4 and 5 are designated by the same reference characters. However, those parts need not necessarily be identical with those shown in FIGS. 2, 4 and 5.

Referring to FIG. 6, the cylindrical member 11 having the inner surface 11b coated with the intermediate film 12 is fixedly mounted on an insulating work support 10 at the lower part thereof in a vacuum vessel 13 provided with a gas inlet port 15 and a gas outlet port 17, with an anode 31 and a filament 33 therein.

An auxiliary electrode 23' is inserted in the bore 11a of the cylindrical member 11 coaxially with the latter. The auxiliary electrode 23' is connected to the vacuum vessel 13 connected to earth to keep the auxiliary electrode 23' at a ground potential. The auxiliary electrode 23 used in the second intermediate film forming process may be used as the auxiliary electrode 23', or the auxiliary electrode 23' may be a different rod-shaped auxiliary electrode of a metal, such as a stainless steel.

Gases are removed through the gas outlet port 17 to evacuate the vacuum vessel 13 to a vacuum of $3 \times 10^{-5}$ torr by an evacuating means, not shown.

Then, benzene gas ($C_6H_6$), i.e., a gas containing carbon, is supplied through the gas inlet port 15 into the vacuum vessel 13 so that the interior of the vacuum vessel 13 is kept at a vacuum of $5 \times 10^{-3}$ torr.

Then a DC voltage of +10 V is applied from an anode power source 27 to the anode 31, and an AC voltage of 10 V is applied from a filament power source 29 to the filament 33 so as to permit a current of 30 A to flow to the filament 33. Further, a DC voltage of -3 kV is applied from a DC power source 25 to the cylindrical member 11 to produce a plasma in the vacuum vessel 13.

Since at this time the auxiliary electrode at the ground potential is inserted in the bore 11a of the cylindrical member 11, the plasma is produced in the bore 11a as well as around the cylindrical member 11. Consequently, a hard carbon film (DLC film) of about 1 μm to 5 μm is formed over the entire surface of the cylindrical member 11.

Since the auxiliary electrode 23' is inserted in the bore 11a of the cylindrical member 11 coated with the intermediate film 12 in which equal potentials are opposed to each other during the hard carbon film forming process, hollow discharge, i.e., abnormal discharge, does not occur and the hard carbon film 3 sticks to the intermediate film with an enhanced adhesion.

The potential characteristic of the space in the bore 11a of the cylindrical member 11 is uniform over the entire coaxial length thereof, thus the hard carbon film can be formed with a uniform thickness on the second intermediate film coating the inner surface 11b over the entire length of the inner surface 11b.

Moreover, since each intermediate film underlying the hard carbon film is formed with a uniform thickness over the entire inner surface 11b of the cylindrical member 11, the hard carbon film and the intermediate film 2 will not remove.

Accordingly, the hard carbon film 3 sticks to the cylindrical member 11 with an advanced adhesion when the intermediate film 12 and the hard carbon film 3 are formed on the inner surface 11b of the cylindrical member 11 by the first and second intermediate film forming process and the hard carbon film forming process in accordance with the present invention.

Although the auxiliary electrodes 23' employed in this hard carbon film forming process may be of any thickness as long as the thickness thereof is smaller than the diameter of the bore 11a of the cylindrical member 11, preferably, the auxiliary electrode 23' has a thickness that allows for a space of about 4 mm between the inner surface 11b of the cylindrical member 11 and the auxiliary electrode 23' to secure a sufficient space for producing the plasma therein.

Preferably, the auxiliary electrode 23' has a length substantially equal to the length of the axial dimension of the bore 11a, or slightly protrudes from the cylindrical member 11 when it is inserted into the cylindrical member 11.

Hard Carbon Film Forming Process in Example 2: FIG. 7

A hard carbon film forming process in a second example will be described with reference to FIG. 7, in which parts corresponding to those shown in FIGS. 2, 4 and 5 are designated by the same reference characters. However, those parts need not necessarily be identical with those shown in FIGS. 2, 4 and 5.

An anode 31 and a filament 33 are not disposed in the interior of a vacuum vessel 13 employed in this case.

The cylindrical member 11 having the inner surface 11b coated with the intermediate film 12 is fixedly mounted on an insulating work support 10 disposed on the bottom wall of the vacuum vessel 13 in the same way as in the foregoing example. An auxiliary electrode 23' connected to ground is inserted coaxially in the bore 11a. The auxiliary electrode 23 used in the second intermediate film forming process may be used as the auxiliary electrode 23', or the auxiliary electrode 23' may be a different rod-shaped auxiliary electrode of a metal, such as a stainless steel.

The vacuum vessel 13 is evacuated to a vacuum of $3 \times 10^{-5}$ torr. Then, methane ($CH_4$), i.e., a gas containing carbon, is supplied through the gas inlet port 15 into the vacuum vessel 13 so that the interior of the vacuum vessel 13 is adjusted to be at a vacuum of 0.1 torr.

A radio frequency power source 21 of 13.56 MHz oscillation frequency applies a radio frequency power of 400 W through a matching circuit 49 to the cylindrical member 11 to produce a plasma around the cylindrical member 11 of the vacuum vessel 13, and a hard carbon film 3 is formed on the entire surface including the intermediate layer 12 over the inner surface 11b of the cylindrical member 11 by a plasma CVD process.

Also in this case, since the auxiliary electrode 23' of the ground potential is disposed in the bore 11a of the cylindrical member 11, a plasma is produced not only in an outer periphery of the cylindrical member 11, but also in the bore 11a, the hard carbon film 3 is formed on the intermediate film 12 coating the inner surface 11b.

Since other conditions, functions and effect are the same as those of Example 1 of the hard carbon film forming process set forth above, the description thereof will be omitted.

Hard Carbon Film Forming Process in Example 3: FIG. 8

A hard carbon film forming process in a third example will be described with reference to FIG. 8, in which parts corresponding to those shown in FIGS. 2, 4 and 5 are designated by the same reference characters. However, those parts need not necessarily be identical with those shown in FIGS. 2, 4 and 5.

As shown in FIG. 8, the cylindrical member 11 having the inner surface 11b coated with the intermediate film 12 is fixedly mounted on an insulating work support 10 disposed on the bottom wall of the vacuum vessel 13. An auxiliary electrode 23' connected to earth is inserted coaxially in the bore 11a. The auxiliary electrode 23 used in the second intermediate film forming process may be used as the auxiliary electrode 23' or the auxiliary electrode 23' may be a different rod-shaped auxiliary electrode of a metal, such as a stainless steel.

The vacuum vessel 13 is evacuated to a vacuum of $3 \times 10^{-5}$ torr. Then, methane ($CH_4$), i.e., a gas containing carbon, is supplied through the gas inlet port 15 into the vacuum vessel 13 so that the interior of the vacuum vessel 13 is kept at a vacuum of 0.1 torr.

A DC power source 25 applies a DC voltage of -600 V to produce a plasma around the cylindrical member 11 in the vacuum vessel 13 to form a hard carbon film over the entire surface of the cylindrical member 11.

Since in this case the auxiliary electrode 23' of the ground potential is also inserted in the bore 11a of the cylindrical member 11, the plasma is produced in the bore 11a as well as around the cylindrical member 11 and, consequently, the hard carbon film 3 is also formed on the intermediate film 12 formed over the inner surface 11b.

In this embodiment also, since the auxiliary electrode 23' is inserted in the bore 11a of the cylindrical member 11 coated with the intermediate film 12 in which equal potentials are opposed to each other during the hard carbon film forming process, hollow discharge, i.e., abnormal discharge, does not occur and the hard carbon film 3 sticking to the intermediate film 2 with an enhanced adhesion can be formed. The hard carbon film 3 can be formed with a uniform thickness over the entire inner surface 11b from the open end to the depth of the bore 11a of the cylindrical member 11.

Example 3 is the same in other conditions, functions and effects as Example 1, and hence further description of Example 3 will be omitted.

Supplemental Remarks

The hard carbon film forming process and the first and second intermediate film forming processes may be carried out in separate vacuum vessels or may be carried out in one vacuum vessel. The intermediate film forming process and the hard carbon film forming process may be carried out continuously in one vacuum vessel.

Preferably, the intermediate film and the hard carbon film are formed continuously by same film forming apparatus, because the adhesion between the intermediate film formed over the inner surface of the cylindrical member and the hard carbon film is enhanced.

When forming the intermediate film and the hard carbon film continuously by one film forming apparatus, the auxiliary electrode 23 is connected to ground after the second intermediate film has been formed, a negative DC voltage or a radio frequency power is applied to the cylindrical member 11, and a gas containing carbon is supplied through the gas inlet port 15 into the vacuum vessel.

Further, if the second intermediate film forming process is carried out by the same plasma CVD process as the hard carbon film forming process, these processes can be carried out continuously and easily using the same apparatus by merely changing the gas supplied through the gas inlet port 15.

Although the hard carbon film forming processes described with reference to FIGS. 6 to 8 use methane gas or benzene gas as a gas containing carbon, a gas containing carbon other than methane gas or benzene gas, such as ethane gas, or a vapor of a liquid containing carbon, such as hexane, may be used.

The three modes of the first intermediate film forming processes, the three modes of the second intermediate film forming processes and the three modes of hard carbon film forming processes may be used in any one of twenty-seven possible combinations.

Actual values mentioned in the foregoing description of the embodiments are only examples; those values are subject to variation according to the materials, shapes and dimensions of the cylindrical member and the auxiliary electrodes.

Since each of the second intermediate film forming processes and hard carbon film forming processes described with reference to FIGS. 6 to 8 form a plasma around the cylindrical member 11 and in the bore 11a thereof, the second intermediate film and the hard carbon film are formed over both the outer and the inner surface of the cylindrical member 11.

However, it is possible to form the second intermediate film 12b and the hard carbon film 3 only over the inner surface 11b by coating the outer surface of the cylindrical member 11 with a coating material; simply, by wrapping aluminum foil around the outer surface of the cylindrical member 11.

The auxiliary electrode 23' inserted in the bore 11a of the cylindrical member 11 may be connected to the positive electrode of a DC power source instead of being connected to ground to keep the same at a ground potential during the second intermediate film forming processes and the hard carbon forming processes, thereby forming the second intermediate film or the hard carbon film.

The application of a positive DC voltage to the auxiliary electrode 23' to form the second intermediate film or the hard carbon film forming process provides the following effects.

When a positive DC voltage is applied to the auxiliary electrode 23', electrons collect around the auxiliary electrode 23' in a high electron density. Consequently, the probability of collisions between molecules containing silicon, germanium or carbon and electrons increases necessarily and thereby the ionization of gas molecules is promoted, so the plasma density around the auxiliary electrode 23' increases.

Therefore, when a positive DC voltage is applied to the auxiliary electrode 23', a second intermediate film or a hard carbon film is deposited at a deposition rate higher than that at which a second intermediate film or a hard carbon film is deposited with the auxiliary electrode 23' kept at the ground potential.

When the diameter of the bore 11a of the cylindrical member 11 is small and a space of only a small size is secured around the auxiliary electrode 23', no plasma can be produced in the bore 11a of the cylindrical member 11 and neither second intermediate film nor hard carbon film 3 can be formed if no positive DC voltage is applied to the auxiliary electrode 23'.

When a positive DC voltage is applied to the auxiliary electrode 23' when forming a second intermediate film or a hard carbon film, electrons can forcibly be collected around the auxiliary electrode 23' by the positive DC voltage applied to the auxiliary electrode 23' inserted in the bore 11a of the cylindrical member 11. Consequently, a plasma can be produced around the auxiliary electrode 23' and a second intermediate film and a hard carbon film 3 can be formed over the inner surface 11b of the cylindrical member 11 even if the diameter of the bore 11a is small.

Although the first intermediate film forming process keeps the cylindrical member 11 at a ground potential, a negative DC voltage may be applied to the cylindrical member 11. When the cylindrical member 11 is made of an insulating material, such as a ceramic material, a first intermediate film of a material forming the auxiliary electrode 23 can be formed with a uniform thickness over the inner surface of the cylindrical member 11 even if the cylindrical member 11 is not grounded, no negative DC voltage is applied to the cylindrical member 11 and the cylindrical member 11 is kept at a floating potential.

As is apparent from the foregoing description, in the first and second intermediate film forming processes and the hard carbon film forming process of the method of forming a film over the inner surface of a cylindrical member in accordance with the present invention, the auxiliary electrode is inserted in the bore of the cylindrical member, i.e., a base member, and a plasma is produced around the auxiliary electrode in the bore of the cylindrical member or resistance heating evaporation is carried out to form the first and second intermediate films and the hard carbon film.

Since the auxiliary electrode at a ground potential or a negative DC potential is inserted in the bore of the cylindrical member, electrodes of an equal potential are not opposed directly to each other. Such a potentials condition is most desirable for plasma chemical vapor deposition (PCVD) so that hollow discharge, i.e., abnormal discharge, does not occur. Therefore, the intermediate film and the hard carbon film stick to the contiguous surfaces with an enhanced adhesion.

Moreover, the hard carbon film and the intermediate film can be formed with a uniform thickness over the entire inner surface from the open end to the depth of the bore of the cylindrical member.

What is claimed is:

1. A method of forming films over an inner surface of a cylindrical member having a bore, said method comprising:
    a first intermediate film forming process comprising steps of:
        placing the cylindrical member in a vacuum vessel;
        inserting an auxiliary electrode of a first intermediate film forming material in the bore of the cylindrical member forming the inner surface;
        keeping the cylindrical member at a ground potential, or applying a negative DC voltage to the cylindrical member;
        supplying a sputtering gas into the vacuum vessel after evacuating the vacuum vessel; and
        applying a negative DC voltage to the auxiliary electrode to produce a plasma around the auxiliary electrode in the bore of the cylindrical member in order that the first intermediate film forming material is sputtered from the auxiliary electrode and is deposited so as to form the first intermediate film having enhanced adhesion with the cylindrical member over the inner surface of the cylindrical member,
    a second intermediate film forming process comprising steps of:
        placing the cylindrical member having the first intermediate film formed over the inner surface thereof in the vacuum vessel;
        inserting an auxiliary electrode in the bore of the cylindrical member;
        keeping the cylindrical member at a ground potential, or applying a positive DC voltage to the cylindrical member;
        supplying a gas containing silicon or germanium into the vacuum vessel after evacuating the vacuum vessel; and
        applying a voltage to the cylindrical member to produce a plasma in the vacuum vessel so as to form a second intermediate film having enhanced adhesion with a diamond-like carbon (DLC) film on the first intermediate film over the inner surface of the cylindrical member by a plasma CVD process, and
    a diamond-like carbon (DLC) film forming process comprising steps of:
        placing the cylindrical member having the first and second intermediate films formed over the inner surface thereof in the vacuum vessel;
        inserting an auxiliary electrode in the bore of the cylindrical member;
        keeping the auxiliary electrode at a ground potential, or applying a positive DC voltage to the cylindrical member;
        supplying a gas containing carbon into the vacuum vessel after evacuating the same; and
        applying a voltage to the cylindrical member to produce a plasma in the vacuum vessel by a plasma CVD process in order that the diamond-like carbon (DLC) film is deposited on the second intermediate film formed over the inner surface of the cylindrical member.

2. The method of forming films over an inner surface of a cylindrical member according to claim 1, wherein
    by using a vacuum vessel having an anode and a filament disposed therein, a DC voltage is applied to the cylindrical member, another DC voltage is applied to the anode and an AC voltage is applied to the filament to produce a plasma in the vacuum vessel in the second intermediate film forming process.

3. The method of forming films over an inner surface of a cylindrical member according to claim 1, wherein
    a radio frequency power is applied to the cylindrical member to produce a plasma in the vacuum vessel in the second intermediate film forming process.

4. The method of forming films over an inner surface of a cylindrical member according to claim 1, wherein
    a DC voltage is applied to the cylindrical member to produce the plasma in the vacuum vessel in the second intermediate film forming process.

5. The method of forming films over an inner surface of a cylindrical member according to claim 1, wherein
    by using a vacuum vessel having an anode and a filament disposed therein, a DC voltage is applied to the cylindrical member, another DC voltage is applied to the anode and an AC voltage is applied to the filament to produce the plasma in the vacuum vessel in the DLC film forming process.

6. The method of forming films over an inner surface of a cylindrical member according to claim 1, wherein
    a radio frequency power is applied to the cylindrical member to produce the plasma in the vacuum vessel in the DLC film forming process.

7. The method of forming films over an inner surface of a cylindrical member according to claim 1, wherein
    a DC voltage is applied to the cylindrical member to produce the plasma in the vacuum vessel in the DLC film forming process.

8. A method of forming films over an inner surface of a cylindrical member having a bore, said method comprising:
    a first intermediate film forming process comprising steps of:
        placing the cylindrical member in a vacuum vessel;
        inserting an auxiliary electrode of a first intermediate film forming material in the bore of the cylindrical member forming the inner surface;
        keeping the cylindrical member at a ground potential, or applying a negative DC voltage is applied to the cylindrical member; and
        applying an AC voltage to the auxiliary electrode after evacuating the vacuum vessel to form a first intermediate film having enhanced adhesion with the cylindrical member over the inner surface of the cylindrical member by resistance heating evaporation of a first intermediate film forming material,
    a second intermediate film forming process comprising steps of:
        placing the cylindrical member having the first intermediate film formed over the inner surface thereof in the vacuum vessel;
        inserting an auxiliary electrode in the bore of the cylindrical member;

keeping the cylindrical member at a ground potential, or applying a positive DC voltage to the cylindrical member;

supplying a gas containing silicon or germanium into the vacuum vessel after evacuating the vacuum vessel; and applying a voltage to the cylindrical member to produce a plasma in the vacuum vessel so as to form a second intermediate film having enhanced adhesion with a diamond-like carbon (DLC) film on the first intermediate film over the inner surface of the cylindrical member by a plasma CVD process, and a diamond-like carbon (DLC) film forming process comprising steps of:

placing the cylindrical member having the first and second intermediate films formed over the inner surface thereof in the vacuum vessel;

inserting an auxiliary electrode in the bore of the cylindrical member and keeping the auxiliary electrode at a ground potential, or applying a positive DC voltage to the cylindrical member;

supplying a gas containing carbon into the vacuum vessel after evacuating the same; and applying a voltage to the cylindrical member to produce a plasma in the vacuum vessel by a plasma CVD process in order that the diamond-like carbon (DLC) film is deposited on the second intermediate film formed over the inner surface of the cylindrical member.

9. The method of forming films over an inner surface of a cylindrical member according to claim 8, wherein a vacuum vessel having an anode and a filament disposed therein is used, a DC voltage is applied to the cylindrical member, another DC voltage is applied to the anode and an AC voltage is applied to the filament to produce a plasma in the vacuum vessel in the second intermediate film forming process.

10. The method of forming films over an inner surface of a cylindrical member according to claim 8, wherein a radio frequency power is applied to the cylindrical member to produce a plasma in a vacuum vessel in the second intermediate film forming process.

11. The method of forming films over an inner surface of a cylindrical member according to claim 8, wherein a DC voltage is applied to the cylindrical member to produce the plasma in the vacuum vessel in the second intermediate film forming process.

12. The method of forming films over an inner surface of a cylindrical member according to claim 8, wherein a vacuum vessel having an anode and a filament disposed therein is used, a DC voltage is applied to the cylindrical member, another DC voltage is applied to the anode and an AC voltage is applied to the filament to produce the plasma in the vacuum vessel in the DLC film forming process.

13. The method of forming films over an inner surface of a cylindrical member according to claim 8, wherein a radio frequency power is applied to the cylindrical member to produce the plasma in the vacuum vessel in the DLC film forming process.

14. The method of forming films over an inner surface of a cylindrical member according to claim 8, wherein a DC voltage is applied to the cylindrical member to produce the plasma in the vacuum vessel in the DLC film forming process.

15. A method of forming films over an inner surface of a cylindrical member having a bore, said method comprising:

a first intermediate film forming process comprising steps of:

placing the cylindrical member in a vacuum vessel;

inserting an auxiliary electrode of a first intermediate film forming material in the bore of the cylindrical member forming the inner surface;

keeping the cylindrical member at a ground potential, or applying a negative DC voltage to the cylindrical member;

supplying a sputtering gas into the vacuum vessel after evacuating the vacuum vessel; and applying radio frequency power to the auxiliary electrode to produce a plasma around the auxiliary electrode in the bore of the cylindrical member in order that the first intermediate film forming material is sputtered from the auxiliary electrode and is deposited so as to form the first intermediate film having enhanced adhesion with the cylindrical member over the inner surface of the cylindrical member, a second intermediate film forming process comprising steps of:

placing the cylindrical member having the first intermediate film formed over the inner surface thereof in the vacuum vessel;

inserting an auxiliary electrode in the bore of the cylindrical member;

keeping the auxiliary electrode at a ground potential, or applying a positive DC voltage to the cylindrical member;

supplying a gas containing silicon or germanium into the vacuum vessel after evacuating the vacuum vessel; and applying a voltage to the cylindrical member to produce a plasma in the vacuum vessel so as to form a second intermediate film having enhanced adhesion with a diamond-like carbon (DLC) film on the first intermediate film over the inner surface of the cylindrical member by a plasma CVD process, and a diamond-like carbon (DLC) film forming process comprising steps of:

placing the cylindrical member having the first and second intermediate films formed over the inner surface thereof in the vacuum vessel;

inserting an auxiliary electrode in the bore of the cylindrical member and keeping the auxiliary electrode at a ground potential, or applying a positive DC voltage to the cylindrical member;

supplying a gas containing carbon into the vacuum vessel after evacuating the same; and applying a voltage to the cylindrical member to produce a plasma in the vacuum vessel by a plasma CVD process in order that the diamond-like carbon (DLC) film is deposited on the second intermediate film formed over the inner surface of the cylindrical member.

16. The method of forming films over an inner surface of a cylindrical member according to claim 15, wherein a vacuum vessel having an anode and a filament disposed therein is used, a DC voltage is applied to the cylindrical member, another DC voltage is applied to the anode and an AC voltage is applied to the filament to produce a plasma in the vacuum vessel in the second intermediate film forming process.

17. The method of forming films over an inner surface of a cylindrical member according to claim 15, wherein a radio frequency power is applied to the cylindrical member to produce a plasma in the vacuum vessel in the second intermediate film forming process.

18. The method of forming films over an inner surface of a cylindrical member according to claim 15, wherein
    a DC voltage is applied to the cylindrical member to produce the plasma in the vacuum vessel in the second intermediate film forming process.

19. The method of forming films over an inner surface of a cylindrical member according to claim 15, wherein
    a vacuum vessel having an anode and a filament disposed therein is used, a DC voltage is applied to the cylindrical member, another DC voltage is applied to the anode and an AC voltage is applied to the filament to produce the plasma in the vacuum vessel in the DLC film forming process.

20. The method of forming films over an inner surface of a cylindrical member according to claim 15, wherein
    a radio frequency power is applied to the cylindrical member to produce the plasma in the vacuum vessel in the DLC film forming process.

21. The method of forming films over an inner surface of a cylindrical member according to claim 15, wherein
    a DC voltage is applied to the cylindrical member to produce the plasma in the vacuum vessel in the DLC film forming process.

\* \* \* \* \*